(12) United States Patent
Beach et al.

(10) Patent No.: US 8,916,908 B2
(45) Date of Patent: Dec. 23, 2014

(54) III-NITRIDE HETEROJUNCTION DEVICE

(71) Applicant: International Rectifier Corporation, El Segundo, CA (US)

(72) Inventors: Robert Beach, Altadena, CA (US); Paul Bridger, Altadena, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 13/906,280

(22) Filed: May 30, 2013

(65) Prior Publication Data

US 2013/0264579 A1   Oct. 10, 2013

Related U.S. Application Data

(62) Division of application No. 12/154,341, filed on May 22, 2008, now Pat. No. 8,455,920.

(60) Provisional application No. 60/931,339, filed on May 23, 2007.

(51) Int. Cl.
| | | |
|---|---|---|
| *H01L 29/66* | (2006.01) | |
| *H01L 29/205* | (2006.01) | |
| *H01L 29/778* | (2006.01) | |
| *H01L 29/06* | (2006.01) | |
| *H01L 29/10* | (2006.01) | |
| *H01L 29/20* | (2006.01) | |

(52) U.S. Cl.
CPC ............. *H01L 29/205* (2013.01); *H01L 29/778* (2013.01); *H01L 29/2003* (2013.01); *H01L 29/7787* (2013.01); *H01L 29/0692* (2013.01); *H01L 29/1029* (2013.01)
USPC ............. 257/194; 257/192; 257/E29.246

(58) Field of Classification Search
CPC ............. H01L 29/1029; H01L 29/2003; H01L 29/778; H01L 29/7787; H01L 29/66431; H01L 29/66462; H01L 29/7781; H01L 29/7782; H01L 29/7786; H01L 29/0692; H01L 29/205; H01L 29/203
USPC ................. 257/11, 12, 39, 95, 183, 190–194, 257/E29.247, E29.248, E29.252, E21.406, 257/E21.407, E29.246, E21.403
See application file for complete search history.

(56) References Cited

U.S. PATENT DOCUMENTS

| | | | | |
|---|---|---|---|---|
| 7,408,208 | B2 * | 8/2008 | Herman ...................... | 257/194 |
| 2005/0189561 | A1 * | 9/2005 | Kinzer et al. .................. | 257/192 |
| 2006/0057790 | A1 * | 3/2006 | Clarke et al. .................. | 438/172 |
| 2006/0060871 | A1 * | 3/2006 | Beach ............................. | 257/94 |
| 2006/0065912 | A1 * | 3/2006 | Beach ............................. | 257/194 |

* cited by examiner

*Primary Examiner* — Cuong Q Nguyen
*Assistant Examiner* — Yosef Gebreyesus
(74) *Attorney, Agent, or Firm* — Farjami & Farjami LLP

(57) ABSTRACT

A III-nitride heterojunction semiconductor device having a III-nitride heterojunction that includes a discontinuous two-dimensional electron gas under a gate thereof.

17 Claims, 4 Drawing Sheets

III-NITRIDE HETEROJUNCTION DEVICE

This is a divisional of application Ser. No. 12/154,341 filed May 22, 2008.

RELATED APPLICATION

This application is based on and claims priority to U.S. Provisional Application Ser. No. 60/931,339, filed on May 23, 2007, entitled Apertured Gate Channel for Gate Charge and RQ Reduction, to which a claim of priority is hereby made and the disclosure of which is incorporated by reference.

DEFINITION

III-nitride as used herein refers to a semiconductor alloy that includes nitrogen and a group III element such as Al, Ga, or In, including but not limited to AlN, GaN, AlGan, InGaN, InN, or InAlGaN.

BACKGROUND AND SUMMARY OF THE INVENTION

The present application relates to a semiconductor device.

The losses associated with switch mode power supplies depend on the resistance of the FETs used in the circuit as well as the charge utilized by the driver during the switching event. At higher frequencies, the losses associated with charge, Qg, Qgd, etc., become large, while at high currents, the losses associated with resistance becomes large. The resistance of a device decreases with larger device width and smaller pitch (because of reduced channel and contact resistance), while the switching charge increases, which leads to a trade off between resistive and switching losses. When deciding on optimal device size, performance is generally evaluated by the R*Q product of a device. There are a few strategies for changing the RQ product. One strategy is to change the density of the two-dimensional gas (2-DEG) over the entire wafer during the formation of the III-nitride heterojunction, which leads to a penalty in drift resistance and associated RA product. Another approach is to change the 2-DEG charge in the entire region under the gate during device fabrication. Reducing the charge under the gate lowers the threshold voltage and capacitance. There are a number of ways to reduce the charge under the gate including, recess etching of the gate region, shallow implantation, and using p-type gate materials. The current processes, such as gate recessing, are difficult to control. A standard etching tool will have 10-20% variation across a wafer, which leads to a similar variation in threshold voltage across the wafer.

The invention disclosed here addresses a fundamental limitation to power management in the switch mode power supplies. Specifically, according to an aspect of the present invention, the gate charge is charged without changing the device gate width. More specifically, in a device according to the present invention, instead of reducing the charge under the gate to reduce the gate charge, the gate area is reduced by interrupting conduction under the gate which will reduce both the gate capacitance and conductivity with a smaller impact on resistance since the total ohmic contact area has not been affected. Furthermore, in a device according to the present invention, the size and the density of the ohmic contacts do not need to be adjusted as would be required when there is a blanket reduction of charge in the channel. Moreover, there will be no change in the threshold voltage of the device as may be the case when the charge is reduced in the entire region under the gate. Threshold voltage will not change since the charge density under the unaffected gate area has remained the same. Thus, the threshold voltage, gate charge, and device resistance can be tuned independently.

Advantageously, a process for fabricating a device according to the present invention will be easer compared to processes that require blanket gate charge density reduction. Moreover, the approach disclosed herein is dramatically reduces process influence on device characteristics.

Other features and advantages of the present invention will become apparent from the following description of the invention which refers to the accompanying drawings.

DETAILED DESCRIPTION OF EMBODIMENTS OF THE INVENTION

Figure 1A:
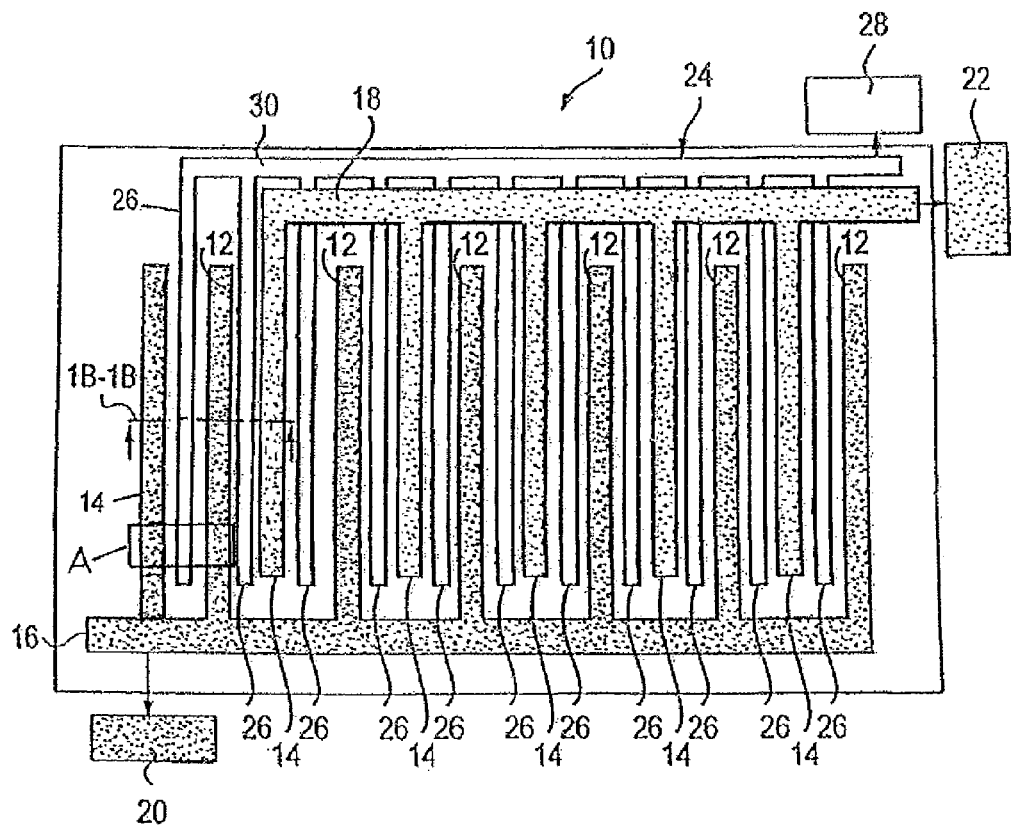
FIG. 1A schematically illustrates a top plan view of an active cell of a power semiconductor device according to the first embodiment of the present invention.
Figure 1B:
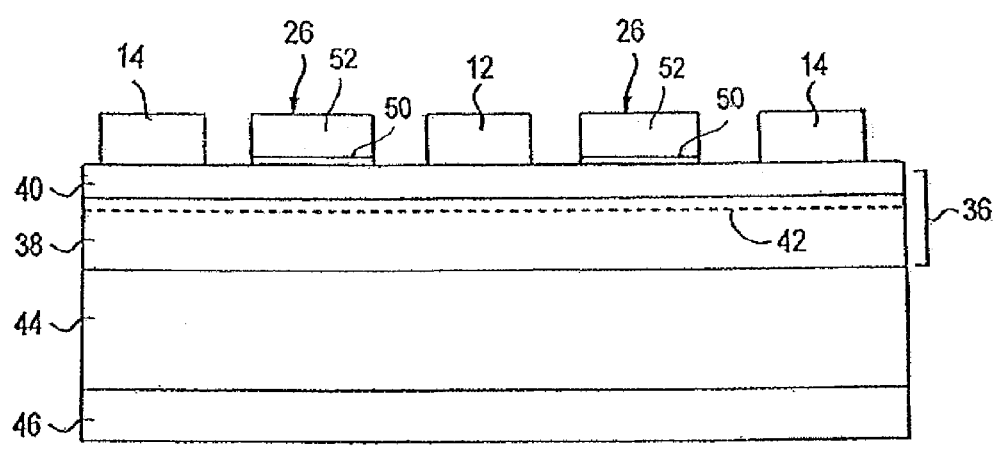
FIG. 1B schematically illustrates a cross-sectional view of the device of FIG. 1A along line 1B-1B viewed in the direction of the arrows.

Referring to FIGS. 1A-1B, a power semiconductor device according to the first embodiment of the present invention is a III-nitride based metal, insulator heterojunction field effect transistor (MISHFET) 10, which includes a plurality of first power electrodes (drain electrodes) 12, and a plurality of second power electrodes (source electrodes) 14 arranged in an interdigitated pattern. Drain electrodes 12 are electrically connected to one another by a respective drain feed 16 and source electrodes 14 are electrically connected to one another by a respective source feed 18. Drain feed 16 is also electrically connected to a first power pad (drain pad) 20 and source feed 18 is electrically connected to a second power pad (source pad) 22. Drain pad 20 and source pad 22 are located somewhere on the die and are used for external power connection.

Device 10 according to the first embodiment further includes a gate structure 24. Gate structure 24 includes a plurality of gate fingers 26 each disposed between a respective drain electrode 12 and source electrode 14. Gate fingers 26 are preferably electrically connected to one another and to gate pad 28 by a common gate feed 30.

Referring specifically to FIG. 1B, a device 10 according to the first embodiment of the present invention includes a III-nitride heterojunction region 36. III-nitride heterojunction region 36 includes first III-nitride semiconductor body 38 and second III-nitride semiconductor body 40 formed over first III-nitride semiconductor body 38. First III-nitride semiconductor body 38 and second III-nitride body 40 have different band gaps, may have different in-plane lattice constants, and are selected so that the heterojunction of the two bodies results in a two-dimensional electron gas (2-DEG) 42 as is well known in the art.

Heterojunction 36 is preferably formed over buffer layer 44 which is formed over substrate 46. Each drain electrode 12, and each source electrode 14 is electrically coupled to heterojunction 36 and 2-DEG 42. For example, each electrode 12, 14 is ohmically connected to second III-nitride semiconductor body 40.

Figure 1C:
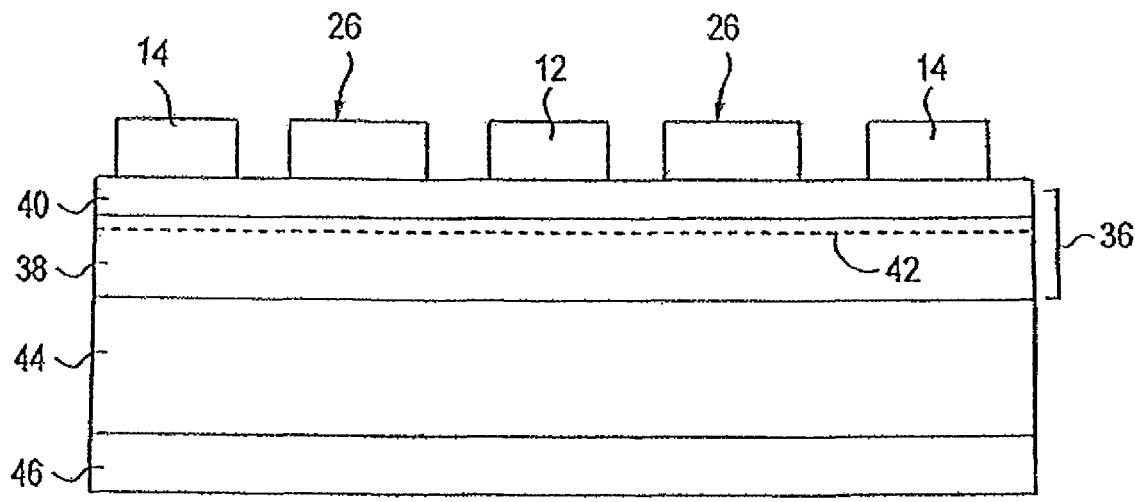
FIG. 1C illustrates an alternative embodiment viewed along line 1B-1B in the direction of the arrows.

In a preferred embodiment of the present invention, each gate finger 26 includes a gate insulation 50, and a gate electrode 52 disposed over gate insulation 50. Alternatively, gate fingers 26 may make schottky contact with second III-nitride semiconductor body 40 thereby forming a heterojunction field effect transistor without deviating from the scope and the spirit of the present invention. For example, each gate finger 26 may make schottky contact with second III-nitride body 40 as illustrated by FIG. 1C.

Figure 2A:
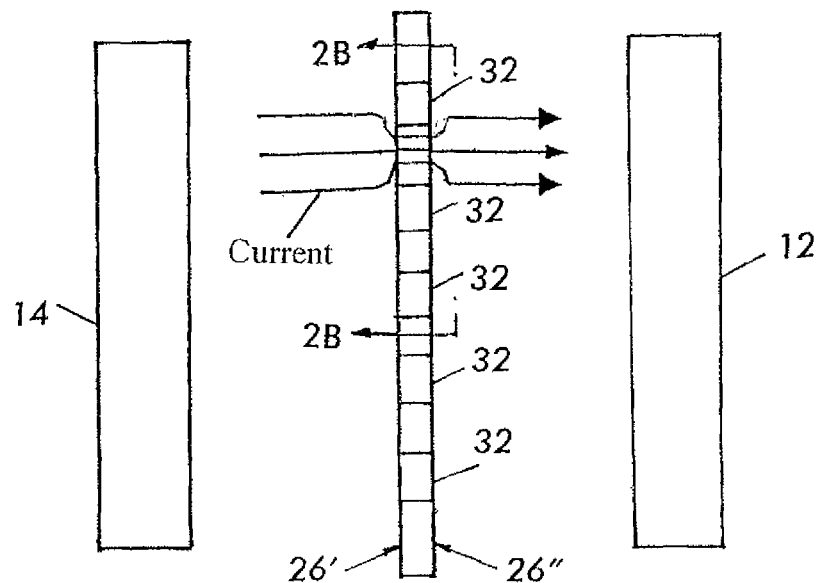
FIG. 2A illustrates an enlarged portion A from FIG. 1A.
Figure 2B:
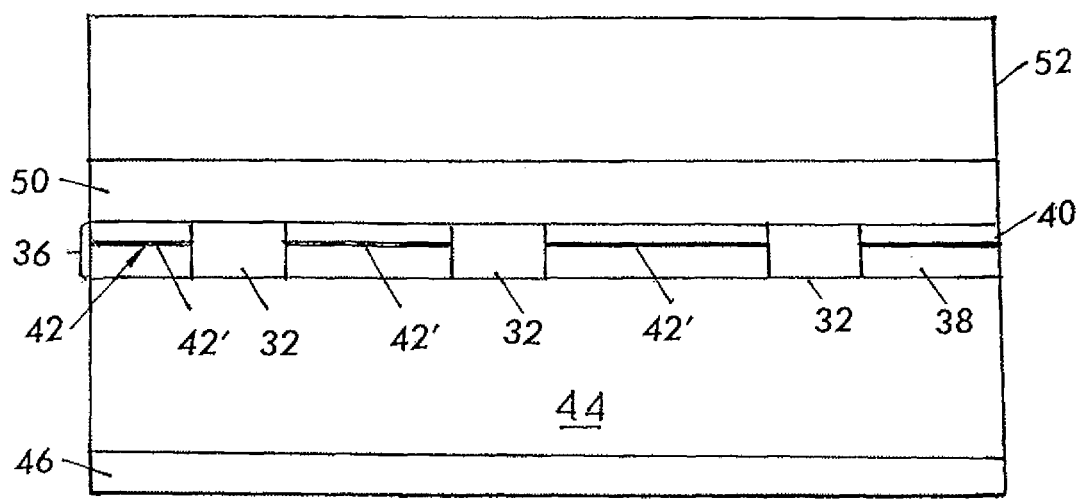
FIG. 2B illustrates a sectional view along line 2B-2B viewed in the direction of the arrows.

Referring to FIGS. 2A and 2B, in which like numerals identify like features, according to one aspect of the present invention, 2-DEG 42 below gate finger 26 of a device according to the present invention is periodically interrupted and thus includes a plurality of spaced interrupted regions 32. Consequently, as illustrated by FIG. 2B, 2-DEG 42 under each gate finger 26 is segmented by interrupted regions 32 whereby 2-DEG 42 under each gate finger 26 becomes a plurality of spaced 2-DEG regions 42'.

Thus, in a device according to the present invention, current passes through the spaces between interrupted regions 32, while the remainder of the area between electrodes 12, 14 is available for conduction, whereby the advantages outlined above are attained.

In the preferred embodiment, first and second power electrodes 12, 14 and gate fingers 26 disposed therebetween are elongated bodies, and spaced interrupted regions 32 are disposed along the length of each gate finger 26. Moreover, at least one of the interrupted regions 32 is laterally bound within (i.e. does not extend beyond) lateral sides 26', 26" of an overlying gate finger 26.

Figures 3A, 3B, 3C:
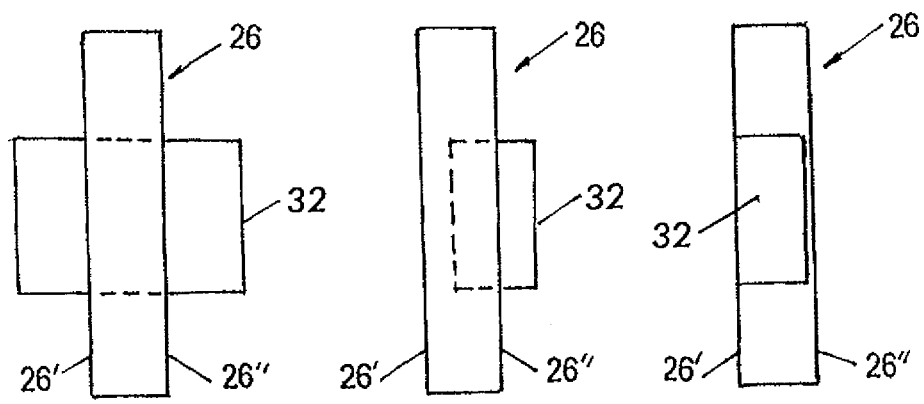
FIG. 3A illustrates an arrangement according to the second embodiment of the present invention.
FIG. 3B illustrates an arrangement according to the third embodiment of the present invention.
FIG. 3C illustrates an arrangement according to the fourth embodiment of the present invention.

Referring now to FIG. 3A, in a second embodiment of the present invention, at least one of the interrupted regions 32 may be wider than the width of and overlying gate finger 26. Thus, as illustrated by FIG. 3A, an interrupted region 32 can extend laterally beyond the lateral sides 26', 26" of a gate finger 26 that is disposed over the interrupted region 32.

Referring to FIG. 3B, in a third embodiment, an interrupted region 32 may extend only partially under a respective gate finger 26, while extending laterally beyond one of the lateral sides (e.g. side 26") of the overlying gate finger 26.

Referring to FIG. 3C, in a fourth embodiment of the present invention, an interrupted region 32 may extend only partially under a gate finger 26, but does not laterally extend beyond a lateral side (e.g. side 26') of the overlying gate finger 26.

Figure 4A:
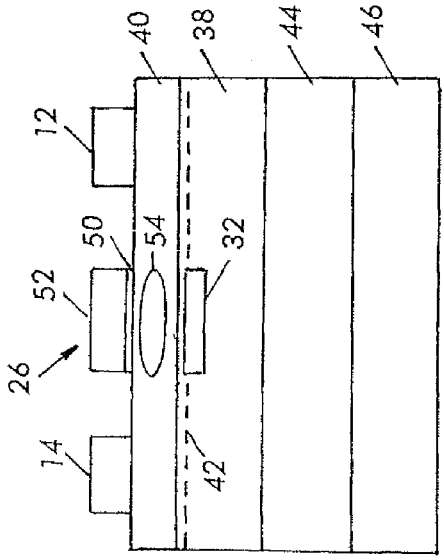
FIGS. 4A-4D illustrate alternative embodiments of a device according to the present invention.
Figure 4B:
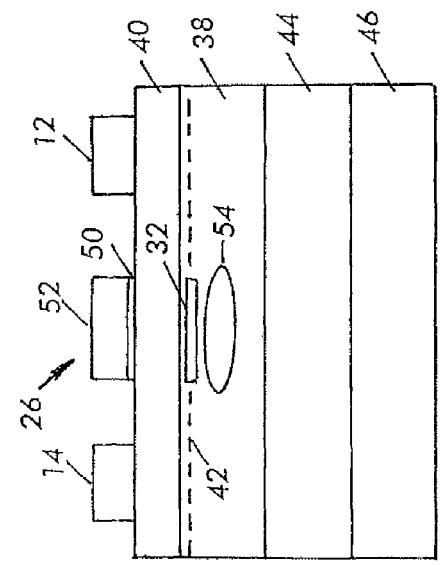
Figure 4C:
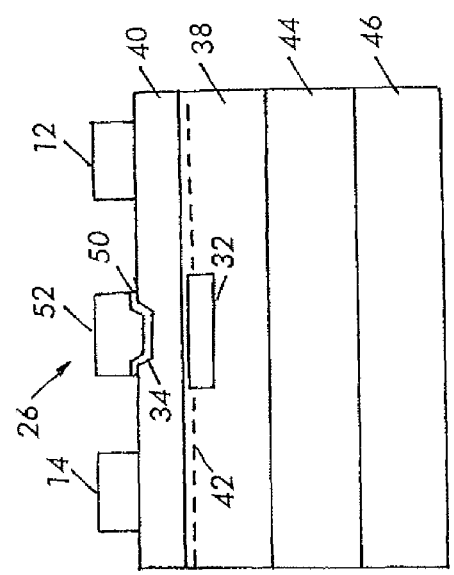
Figure 4D:
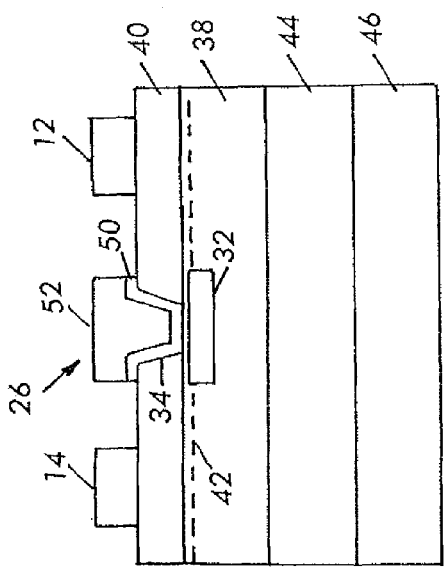

In any one of the embodiments disclosed herein, an interrupted region 32 may be formed by a recess 34 that partially extends through second III-nitride semiconductor body 40 (FIG. 4A), or a recess 34 that extends fully through second III-nitride semiconductor body 40 (FIG. 4B) and reaching first III-nitride semiconductor body 38. Alternatively, a suitable implant into first III-nitride body 38 (FIG. 4D) or second III-nitride body 40 (FIG. 4C) may be employed to obtain an implant region 54 to cause the formation in an interrupted region 32. A suitable implant may be an ion implant such as a fluorine ion implant or a chlorine ion implant, or a transition metal implant such as a Fe, or a Cr, or a V implant.

It should be noted that a device according to the present invention is not restricted to the embodiments disclosed herein. For example, the shape of interrupted regions 32, implant dosage and dosage distribution in interrupted regions 32, and overlap and position of the implanted regions 54 can be adjusted as desired to, for example, obtain a suitable Qgs or Qgd value without deviating from the scope and spirit of the present invention.

Moreover, a device according to the present invention can be fabricated through using any suitable process. To obtain a device according to the present invention, interrupted regions 32 can be formed during the step designed for isolating the individual die in a wafer. For example, recesses 34 may be formed in each die during the same step recesses are formed for isolation purposes. Alternatively, implant regions 54 may be formed to obtain interrupted regions 32 in the same step that is carried out to obtain isolation between individual die in a wafer. The latter may advantageously reduce surface topography.

In a device according to the present invention, first III-nitride semiconductor body 38 may be composed of GaN, second III-nitride semiconductor body 40 may be composed AlGaN, and buffer layer 44 may be composed of AlN. In addition, drain electrodes 12, and source electrodes 14 may be composed of any suitable material such a Ti/Al, Ni/Au, Hf, Si, or another Si containing alloy. A suitable material for gate insulation 50 may be $SiO_2$, $Si_3N_4$, or diamond and a suitable material for gate electrode 52 may be Ti/Al, Ni/Au, Hf, Si, or a Si containing alloy.

Furthermore, substrate 46 is preferably made from Si. However, other substrate materials such as SiC, or sapphire may be used. It should be noted that buffer layer 8 may be omitted if substrate 46 is composed of a material compatible with first III-nitride semiconductor body 38. For example, substrate 46 may be formed from bulk GaN.

Also, it should be noted that although the preferred embodiments include interdigitated power electrodes, other layouts are also possible for lateral devices. For example, the power electrodes may be arranged in cellular or checkerboard patterns without deviating from the scope and spirit of the present invention.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A III-nitride device comprising:
    a III-nitride heterojunction that includes a first III-nitride semiconductor body having one band gap, and a second III-nitride semiconductor body having another band gap disposed on said first III-nitride semiconductor body to generate a two dimensional electron gas;
    a first power electrode disposed over said III-nitride heterojunction and electrically coupled to said two dimensional electron gas;
    a second power electrode disposed over said III-nitride heterojunction and electrically coupled to said two dimensional electron gas;
    a gate arrangement disposed between said first power electrode and said second power electrode;
    spaced interrupted regions in said two-dimensional electron gas below said gate arrangement, wherein said gate arrangement has a width, and at least one of said interrupted regions is wider than said width of said gate arrangement;

wherein said two-dimensional electron gas is segmented by said spaced interrupted regions along a length of said gate arrangement.

2. The III-nitride device of claim 1, wherein said first and second power electrodes are ohmically coupled to said second III-nitride semiconductor body.

3. The III-nitride device of claim 1, wherein said gate arrangement includes an electrode that is Schottky coupled to said second III-nitride semiconductor body.

4. The III-nitride device of claim 1, wherein said gate arrangement includes a gate electrode and a gate insulation body interposed between said gate electrode and said III-nitride heterojunction.

5. The III-nitride device of claim 1, wherein said first power electrode, said second power electrode, and said gate arrangement are parallel elongated bodies.

6. The III-nitride device of claim 1, wherein said interrupted regions are disposed below respective recesses in said second III-nitride semiconductor body.

7. The III-nitride device of claim 1, wherein said interrupted regions comprise recesses formed in said III-nitride heterojunction.

8. The III-nitride device of claim 1, further comprising implant regions in said III-nitride heterojunction each said implant region causing a formation of at least one of said interrupted regions.

9. The III-nitride device of claim 8, wherein said implant regions comprise a transition metal.

10. The III-nitride device of claim 9, wherein said transition metal comprises Fe.

11. The III-nitride device of claim 9, wherein said transition metal comprises Cr.

12. The III-nitride device of claim 9, wherein said transition metal comprises V.

13. The III-nitride device of claim 1, said first III-nitride semiconductor body comprises GaN and said second III-nitride semiconductor body comprises AlGaN.

14. The III-nitride device of claim 1, further comprising a substrate, wherein said III-nitride heterojunction is disposed over said substrate.

15. The III-nitride device of claim 14, wherein said substrate comprises one of Si, SiC, and sapphire.

16. The III-nitride device of claim 14; further comprising a transition layer between said substrate and said III-nitride heterojunction.

17. The III-nitride device of claim 16, wherein said transition layer comprises AlN.

* * * * *